(12) United States Patent
Ma

(10) Patent No.: US 8,497,587 B2
(45) Date of Patent: Jul. 30, 2013

(54) THERMALLY ENHANCED EXPANDED WAFER LEVEL PACKAGE BALL GRID ARRAY STRUCTURE AND METHOD OF MAKING THE SAME

(75) Inventor: Yiyi Ma, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 251 days.

(21) Appl. No.: 12/650,360

(22) Filed: Dec. 30, 2009

(65) Prior Publication Data

US 2011/0156236 A1 Jun. 30, 2011

(51) Int. Cl.
*H01L 23/28* (2006.01)
*H01L 23/34* (2006.01)
*H01L 23/10* (2006.01)

(52) U.S. Cl.
USPC ............... 257/796; 257/706; 257/E23.092; 438/122

(58) Field of Classification Search
USPC ...... 257/690, E21.499, E23.01, 99, 177–181, 257/584, 625, 675, 688, 689, 705, 707, 712–722, 796; 438/122, 15, 25–26, 51, 53, 438/55, 106
See application file for complete search history.

(56) References Cited

U.S. PATENT DOCUMENTS

| | | | | |
|---|---|---|---|---|
| 6,423,570 B1 * | 7/2002 | Ma et al. | ......... | 438/106 |
| 6,432,749 B1 * | 8/2002 | Libres | ........... | 438/122 |
| 2004/0046254 A1 * | 3/2004 | Lin et al. | ......... | 257/734 |
| 2005/0161806 A1 * | 7/2005 | Divakar et al. | ......... | 257/717 |
| 2007/0029683 A1 * | 2/2007 | Tsai et al. | ......... | 257/796 |
| 2007/0065984 A1 * | 3/2007 | Lau et al. | ......... | 438/107 |
| 2008/0032450 A1 * | 2/2008 | Huang | ........... | 438/108 |
| 2008/0212288 A1 * | 9/2008 | Kang et al. | ......... | 361/717 |
| 2008/0290496 A1 * | 11/2008 | Park | ............... | 257/693 |
| 2009/0096085 A1 * | 4/2009 | Lee et al. | ......... | 257/712 |
| 2009/0170241 A1 * | 7/2009 | Shim et al. | ......... | 438/107 |
| 2010/0013106 A1 * | 1/2010 | Otremba et al. | ......... | 257/777 |
| 2010/0320588 A1 * | 12/2010 | Dahilig et al. | ......... | 257/690 |
| 2011/0156239 A1 | 6/2011 | Jin | ............... | 257/692 |

* cited by examiner

*Primary Examiner* — Matthew Landau
*Assistant Examiner* — Khaja Ahmad
(74) *Attorney, Agent, or Firm* — Seed IP Law Group PLLC

(57) ABSTRACT

A thermally enhanced expanded wafer level ball grid array package. The expanded wafer level ball grid array package includes an integrated thermally conductive heat dissipater. In one embodiment the heat dissipater is positioned in close proximity to a non-active face of a die and is separated from the non-active face by a thermal interface material. In another embodiment the heat dissipater includes legs that displace the heat dissipater a short distance from the non-active die face, with the intervening space occupied by encapsulation material. In yet another embodiment, the thermal interface material exists between the non-active die face and the heat dissipater, but extends beyond the edge of the semiconductor die to also cover a portion of the encapsulation material. Methods for making the various embodiments of the expanded wafer level ball grid array package are also shown.

14 Claims, 12 Drawing Sheets

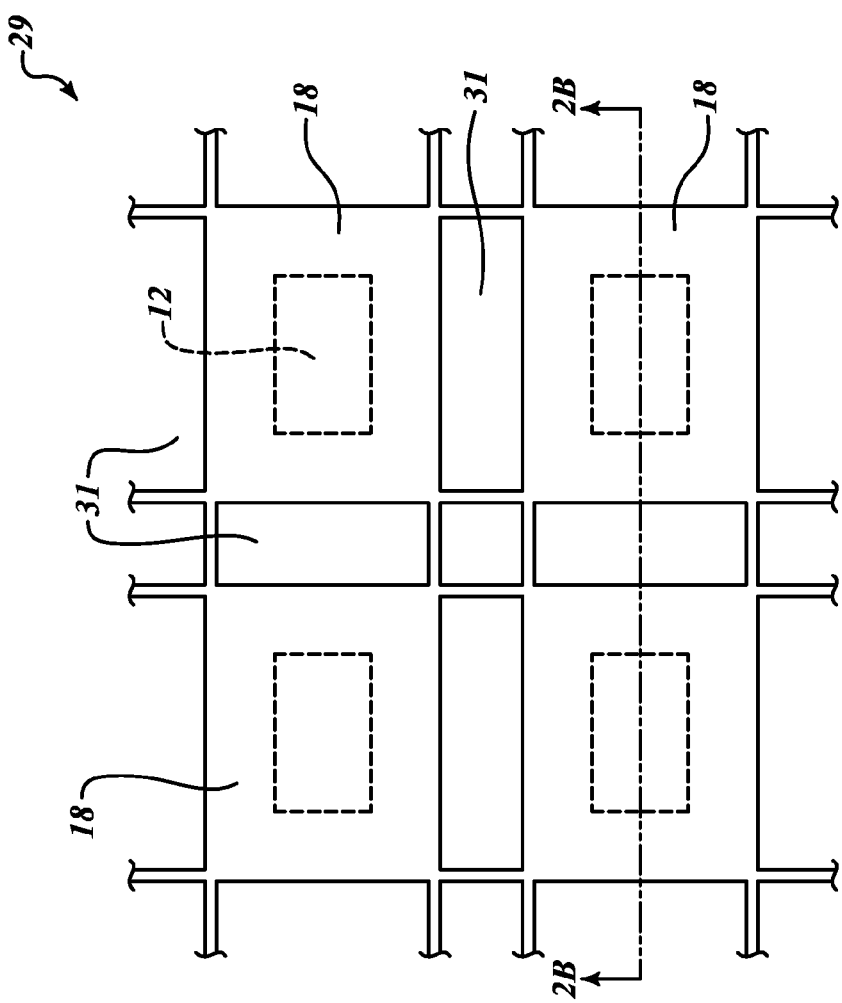
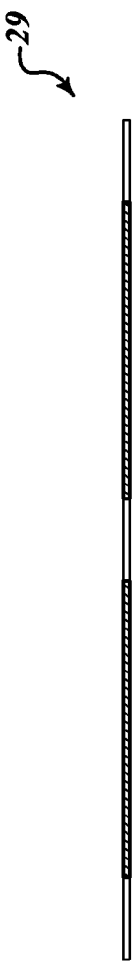

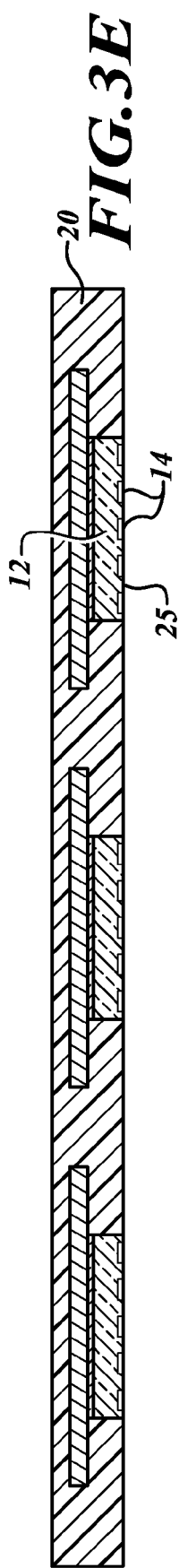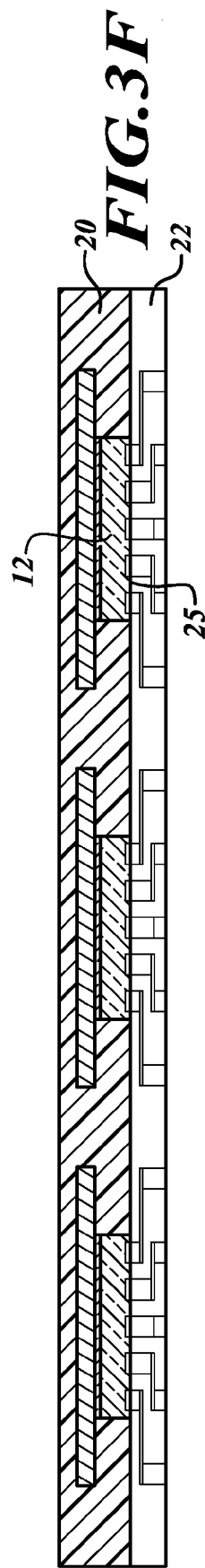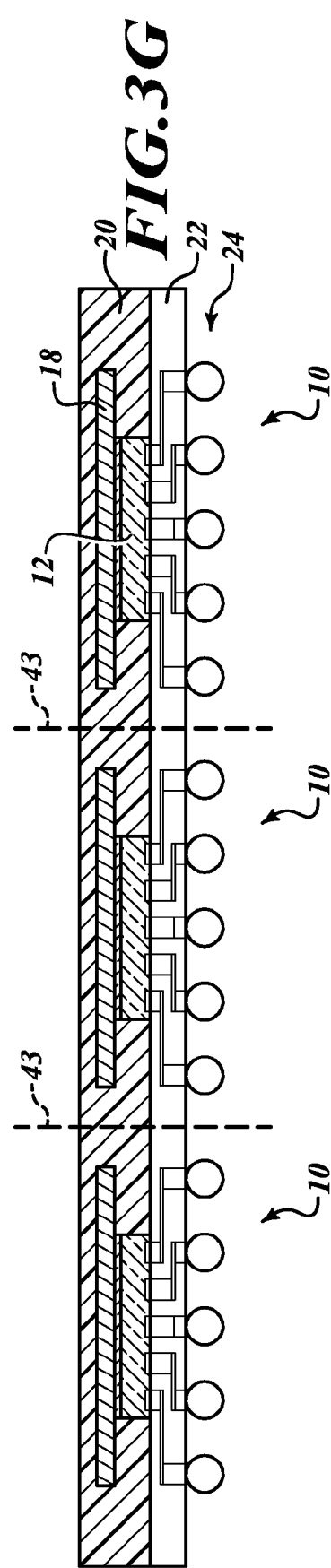

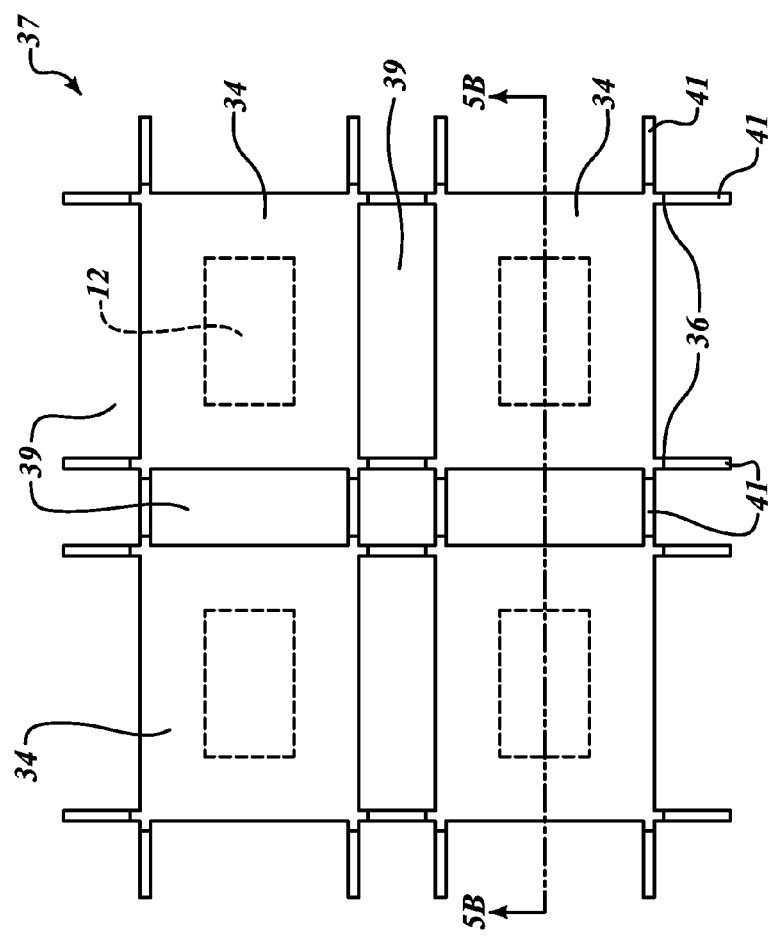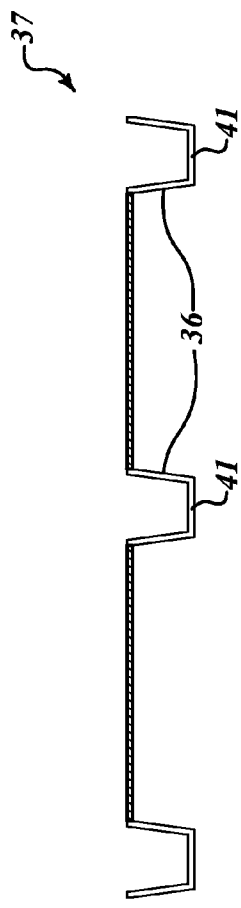

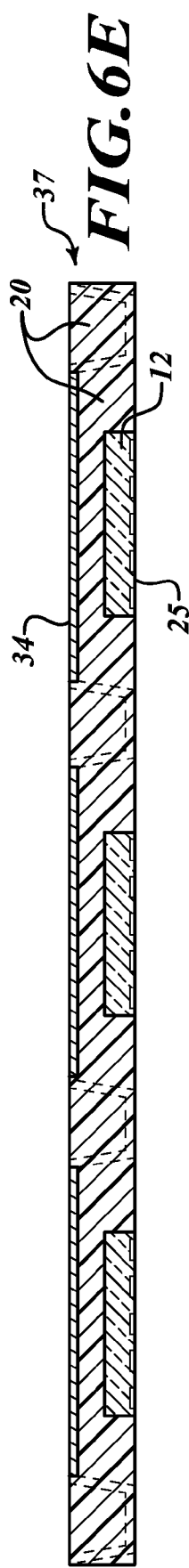
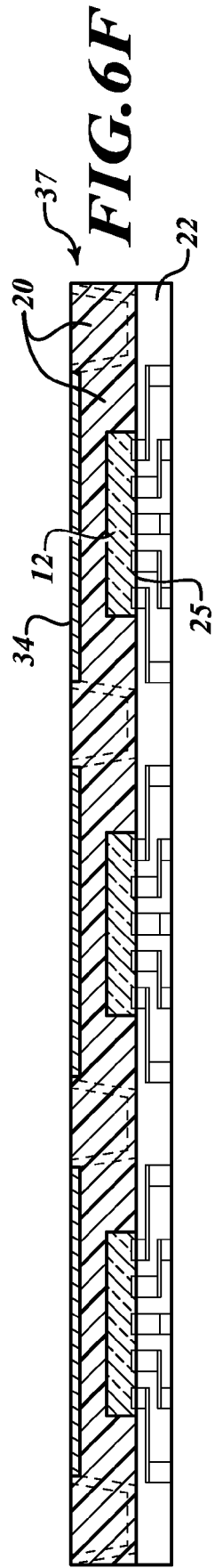
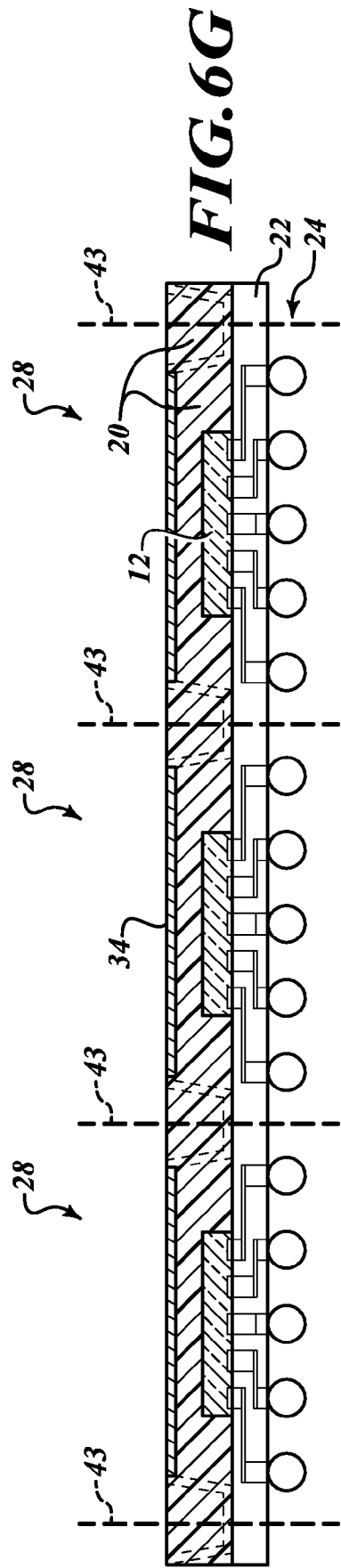

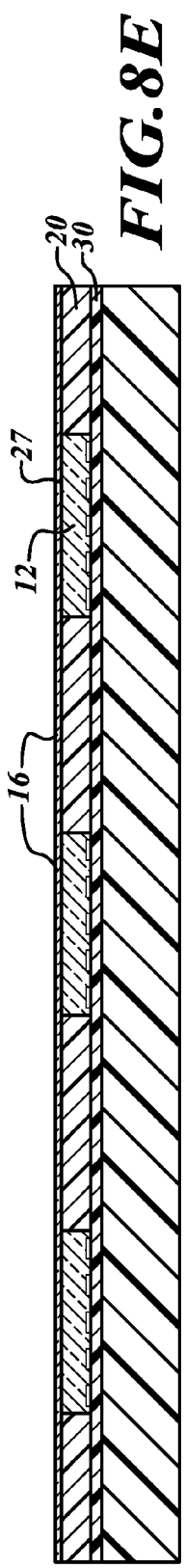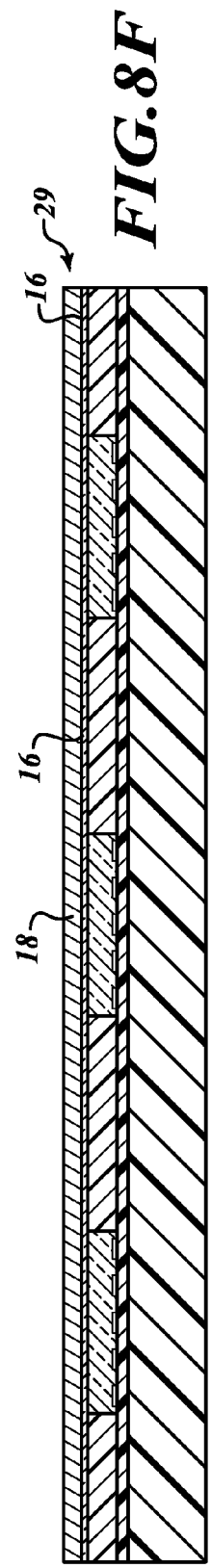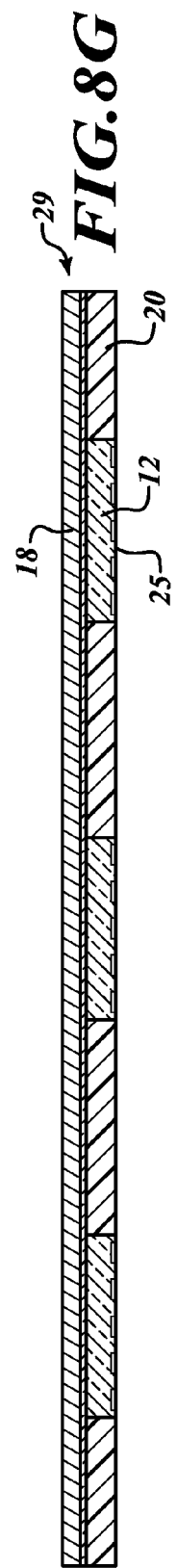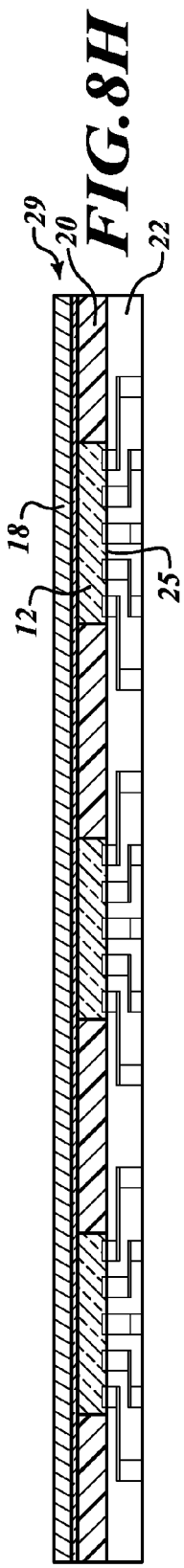

US 8,497,587 B2

THERMALLY ENHANCED EXPANDED WAFER LEVEL PACKAGE BALL GRID ARRAY STRUCTURE AND METHOD OF MAKING THE SAME

BACKGROUND

1. Technical Field

This description generally relates to the field of electronic packaging, and in particular to management of the thermal output of packaged semiconductor electronics.

2. Description of the Related Art

Advances in semiconductor processing techniques have enabled increased circuit density in semiconductor die. One consequence of increased circuit density is that the density of connection pads on the die's active face has also increased, making the interface between the die and external circuitry more crowded. This limitation is frequently overcome using wafer level packaging, which includes printing a redistribution layer directly on the active face of a die, the redistribution layer spanning both the die face and an encapsulant material adjacent to the die. By distributing the connection pads over a wider area, a ball grid array (BGA) can be used to complete the interface between the die and a PC board or other external interface. A side effect of solving the connection pad interface problem is that the concentration of heat needing to be dissipated from wafer level packaged devices is higher.

BRIEF SUMMARY

A thermally enhanced wafer level package ball grid array that dissipates heat from a dense circuit on a semiconductor die is disclosed. The inventive package includes the die, an encapsulation material, a redistribution layer and a thermally conductive heat dissipater. The redistribution layer includes electrical traces and package fan-out pads. The encapsulation material is positioned adjacent to the semiconductor die and supports the redistribution layer. The electrical traces of the redistribution layer electrically connect the fan-out pads to signal output pads on an active face of the die.

In one embodiment the heat dissipater is positioned in close proximity to a non-active face, sometimes termed the back face or rear face, of the die and is separated from the non-active face by a thermal interface material. In another embodiment the heat dissipater includes legs that displace the heat dissipater a short distance from the non-active die face, with the intervening space occupied by the encapsulation material. In yet another embodiment, the thermal interface material exists between the non-active die face and the heat dissipater, but extends beyond the edge of the semiconductor die to also cover a portion of the encapsulation material.

Methods for making the various embodiments of the expanded wafer level ball grid array package are also disclosed. In one embodiment the thermal interface material is dispensed onto the non-active die face, the heat dissipater is placed onto the interface material, and the encapsulation material is dispensed over and around the heat dissipater. In another embodiment the dissipater is placed above the die, using legs of the dissipater to hold the dissipater a short distance from the non-active die face. The encapsulation material is dispensed in and around the dissipater. No thermal interface material is used. In yet another embodiment, the encapsulation material is dispensed over and around the die, and then the encapsulation material is removed to expose the die's non-active face. The thermal interface material is dispensed over both the non-active die face and the encapsulation material and then the dissipater placed on the thermal interface material.

BRIEF DESCRIPTION OF THE SEVERAL VIEWS OF THE DRAWINGS

FIGS. 2A and 2B show a top view and a cross-sectional view of an array of heat dissipaters used in the embodiment of FIG. 1;

FIGS. 3A-3G show in cross-sectional views the steps of a method for making the thermally enhanced expanded wafer level ball grid array package of FIG. 1;

FIGS. 5A and 5B show a top view and a cross-sectional view of an array of heat dissipaters used in the embodiment of FIG. 4;

FIGS. 6A-6G show in cross-sectional views the steps of a method for making the thermally enhanced expanded wafer level ball grid array package of FIG. 4;

FIGS. 8A-8I show in cross-sectional views the steps of a method for making the thermally enhanced expanded wafer level ball grid array package of FIG. 7.

DETAILED DESCRIPTION

Figure 1:
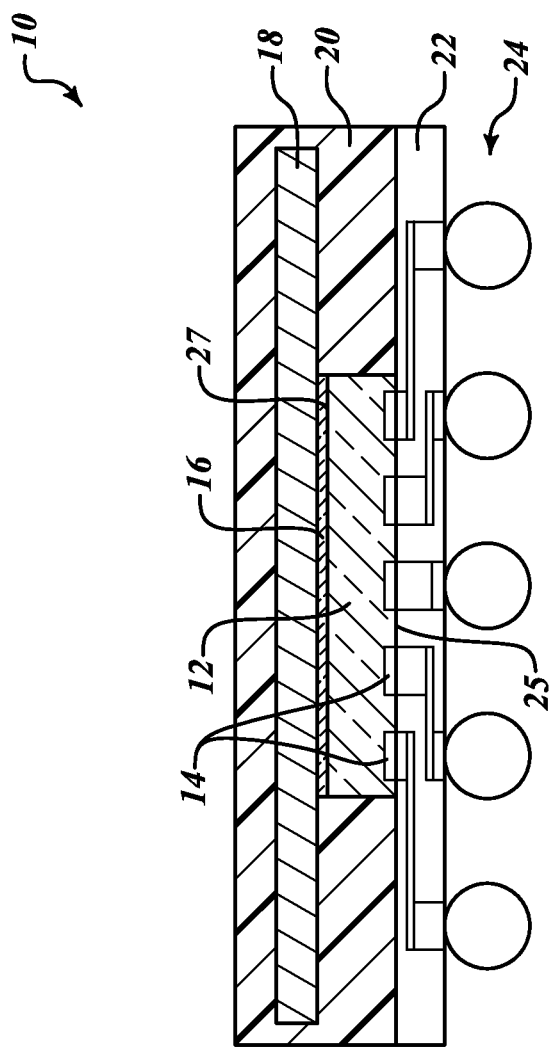
FIG. 1 shows a cross-sectional view of one embodiment of a thermally enhanced expanded wafer level ball grid array package.

FIG. 1 shows one embodiment of a thermally enhanced expanded wafer level ball grid array package 10. The thermally enhanced expanded wafer level ball grid array package 10 includes a semiconductor die 12, connection pads 14, a thermal interface material layer 16, a heat dissipater 18, an encapsulant material 20, a redistribution layer 22, and a ball grid array 24. The semiconductor die 12 is thin compared to its length and width and therefore has two predominant faces 25, 27. The face of the die that includes the connection pads 14 is the active face 25, otherwise referred to as the front side, front face or top face. This is the side of the semiconducting die on which circuits are formed. The opposite face of the die is referred to as the non-active face 27. The non-active face 27 of the semiconductor die 12 is covered by the thermal interface material 16. The thermal interface material 16 is composed of grease or epoxy and typically contains a thermally conductive filler to improve thermal conductivity. The grease or epoxy enhances contact between the heat dissipater 18 and the die 12 by conforming to roughness on either surface that would otherwise prevent the two components from having a high contact area.

The heat dissipater 18 is positioned in direct contact with the thermal interface material layer 16 and in close proximity to the non-active face 27. As with the die 12, the heat dissipater 18 is generally thin compared with its length and width. The heat dissipater 18 has two faces, one facing the die 12 and one facing away from the die 12. The heat dissipater 18 is separated from the semiconductor die 12 by the thermal interface material 16, which occupies the intervening space in order to enhance the thermal contact between them. In some embodiments, a thermal interface layer 16 is not used and the thermal dissipater 18 directly contacts the die 12.

The heat dissipater 18 may extend beyond the edges of the semiconductor die 12 in order to increase the area of the heat dissipater 18. The heat dissipater 18 may be composed of aluminum, Alloy 42, a copper alloy, or any other thermally conductive material. The surface of the heat dissipater 18 may be treated to provide a surface that is advantageous to the transfer of heat from the die 12 to the heat dissipater 18. In one embodiment, the heat dissipater 18 includes features that extend orthogonally from the predominant plane of the heat dissipater 18 and increase an exposed surface area of the heat dissipater 18.

Adjacent to both the semiconductor die 12 and the heat dissipater 18 is an encapsulant material 20. The encapsulant material 20 is a dispensable material that during dispensing conforms to the die 12 and the dissipater 18, but quickly transitions to a rigid state over time, either by cooling or curing, for example. After transitioning to its more rigid state, the encapsulant material 20 includes at least two faces, one approximately co-planar with the active face of the die 12 and the other approximately parallel to and covering an exposed face of the dissipater 18.

The redistribution layer 22 is positioned on the face of the encapsulant material 20 co-planar with the active face of the semiconductor die 12. The redistribution layer 22 spans both the encapsulant material 20 and the active face of the die 12. The redistribution layer 22 is typically composed of printed insulating layers, printed electrically conductive traces, and a solder mask layer, although formation of the redistribution layer 22 can use alternative materials and techniques than the printing method described here. Balls of the ball grid array 24 are connected to conductive connection pads on the redistribution layer 22.

FIGS. 2A and 2B show a heat dissipater frame 29 having a 2×2 array of heat dissipaters 18. The heat dissipater frame 29 also has open areas 31 that separate each heat dissipater 18 from one another in the frame 29. Each heat dissipater 18 of the frame 29 corresponds to one electronic package having at least one semiconducting die 12 each. In the embodiment of FIGS. 1 and 2, there is one die 12 for each dissipater 18, located at approximately the center of the heat dissipater 18, as shown in the top side view in FIG. 2A.

The solid region of the heat dissipater 18 conducts heat from the semiconductor die 12 via contact with the thermal interface material 16, which is in contact with the die 12, as shown in FIG. 1. The heat dissipater 18 dissipates the conducted heat outward from its exposed face, helping to maintain the die 12 at a lower temperature.

The open regions 31 between the heat dissipaters 18 of the frame 29 allow encapsulant material 20 to flow underneath the solid regions of the dissipater 18 and up to the edges of the semiconductor die 12 during encapsulant dispensing. The open regions 31 may vary in size and layout, depending on the viscosity of the encapsulant material 20 during dispensing and the density and layout of the die components on the expanded wafer level ball grid array package.

FIGS. 3A-3G show the steps in a method for making the thermally enhanced expanded wafer level ball grid array package 10. The cross-sectional views of FIGS. 3A-3G are taken at the same approximate position as the section line 2B-2B in FIG. 2A, but include three die 12 instead of two. Of course, a heat dissipater frame 29 can be any size and arrays of 10×200 or 2×40 are common.

Figure 3A:
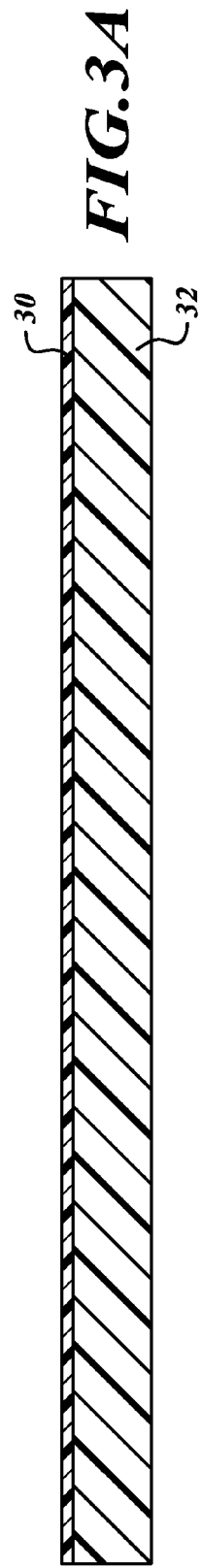
Figure 3B:
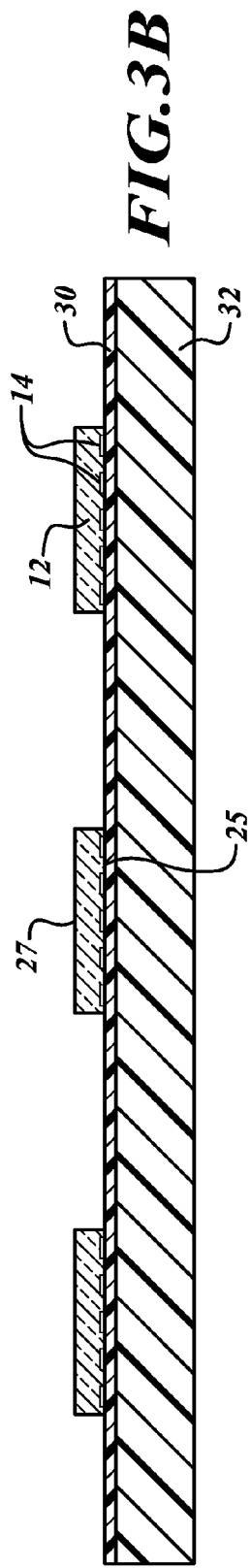

In FIG. 3A, a foil 30 is laminated onto a carrier 32. The side of the foil 30 not laminated to the carrier 32 includes an adhesive that temporarily holds the semiconductor die 12 onto the foil 30 when the die 12 is placed there. In FIG. 3B, the semiconductor die 12 are placed onto the carrier-supported foil 30. The semiconductor die 12 are placed so that the active face 25 of the die 12 faces the foil 30.

Figure 3C:
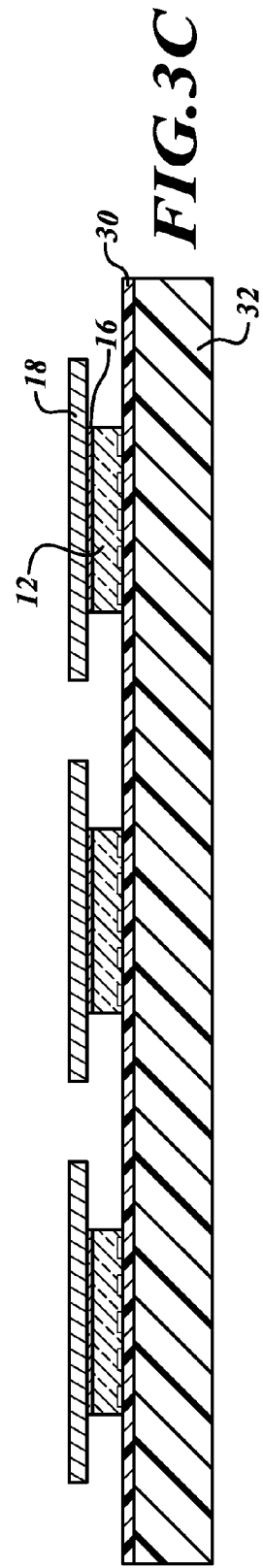

In FIG. 3C, the thermal interface material 16 is dispensed onto the non-active face 27 of the semiconductor die 12. A heat dissipater frame 29 having three heat dissipaters 18 is then placed on the non-active face 27 of the semiconductor die 12 having the thermal interface material 16 dispensed thereon. The heat dissipater frame 29 is placed so that the solid regions are positioned advantageously with respect to the semiconductor die 12 to conduct heat from the die 12, as shown in FIG. 2A.

Figure 3D:
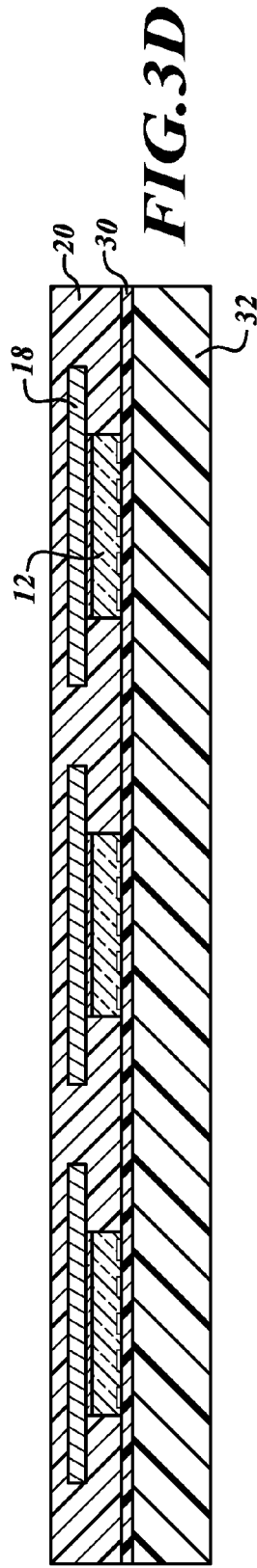

In FIG. 3D, the encapsulant material 20 is dispensed into a region adjacent each semiconductor die 12 between the foil 30 and the heat dissipater 18. The encapsulant material 20 is dispensed through the open regions 31 in the heat dissipater frame 29. Because the carrier 32 is flat and parallel to the die, and because the encapsulant material 12 is conformable, after becoming rigid the dispensed encapsulant material 20 provides a flat surface approximately coincident with the active face 25 of the die 12. In this embodiment of the expanded wafer level ball grid array package 10, the encapsulant material 20 is also dispensed above the heat dissipater 18, so that the surface of the heat dissipater 18 facing away from the die 12 is also covered by the encapsulant material 20.

In some embodiments, the encapsulant material 20 is dispensed so that the top face of the encapsulant material 20 is level with the top face of the thermal dissipater 18. In this embodiment, the encapsulant material 20 helps to hold the dissipater 18 on the die by bonding to the sides and bottom of the dissipater.

In FIG. 3E, the foil 30 and the carrier 32 are removed, exposing the active face 25 of the semiconductor die 12 and a lower face of the encapsulant material 20. In FIG. 3F, the redistribution layer 22 is applied to the exposed active face 25 of the semiconductor die 12 and the encapsulant material 20. In FIG. 3G, balls of the ball grid array 24 are placed on conductive pads of the redistribution layer 22 and each individual expanded wafer level ball grid array package 10 is singulated from the array, by cutting along the dashed lines 43.

Figure 4:
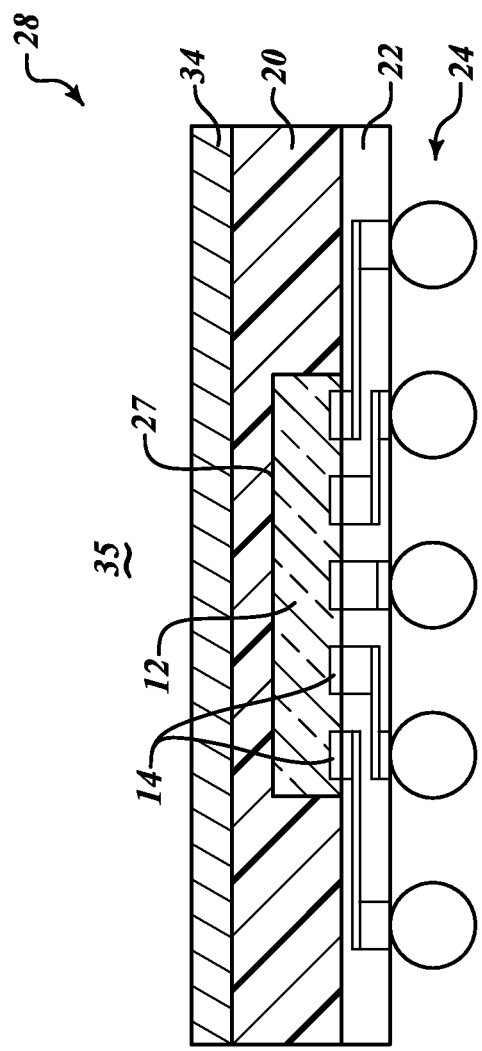
FIG. 4 shows a cross-sectional view of another embodiment of a thermally enhanced expanded wafer level ball grid array package.

FIG. 4 shows another embodiment of a thermally enhanced expanded wafer level ball grid array package 28. This embodiment 28 includes the semiconductor die 12, an alternative heat dissipater 34, the encapsulant material 20, the redistribution layer 22, and the ball grid array 24. Notably, the thermal interface material 16 is absent. In this embodiment of the expanded wafer level ball grid array package 28, the alternative heat dissipater 34 is in close proximity to, but separated from, the non-active face 27 of the semiconductor die 12 by the encapsulant material 20. Furthermore, in this embodiment of the expanded wafer level ball grid array package 28, a surface of the alternative heat dissipater 34 facing away from the semiconductor die 12 is exposed directly to a nearby environment 35. No encapsulant material 20 is positioned between the alternative heat dissipater 34 and the environment 35. The other features of this embodiment 28 are similar to the features of the first embodiment 10 described above.

FIGS. 5A and 5B show an alternative heat dissipater frame 37 having a 2×2 array of the alternative heat dissipater 34 from FIG. 4. The alternative heat dissipater frame 37 has open areas 39 that separate each heat dissipater 34 from one another in the frame 37. The alternative heat dissipater frame 37 also includes vertical legs 36 and feet 41. The vertical legs 36 and feet 41 suspend the heat dissipaters 34 above the die 12 when the frame 37 is placed on the carrier 32, as will be described further in FIG. 6. The composition of the alternative heat dissipater 34 is similar to the composition of the heat dissipater 18, as described earlier.

FIGS. 6A-6G show the steps in a method for making the thermally enhanced expanded wafer level ball grid array package 28 of FIG. 4. The cross-sectional views of FIGS. 6A-6G are taken at the same approximate position as the section line 5B-5B in FIG. 5A, but include three die 12 instead of two.

Figure 6A:
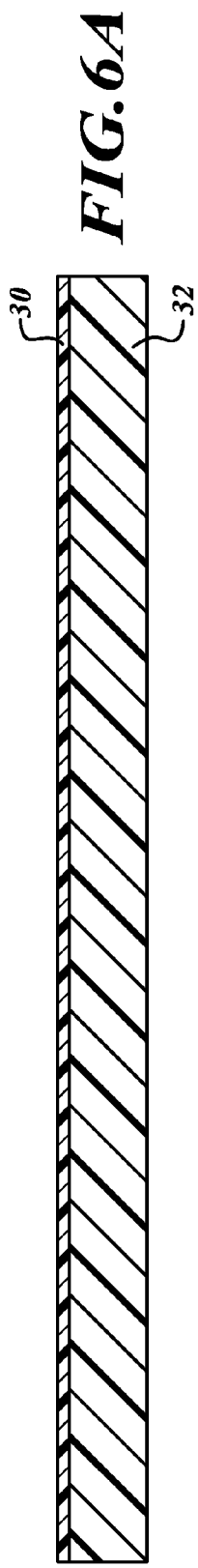
Figure 6B:
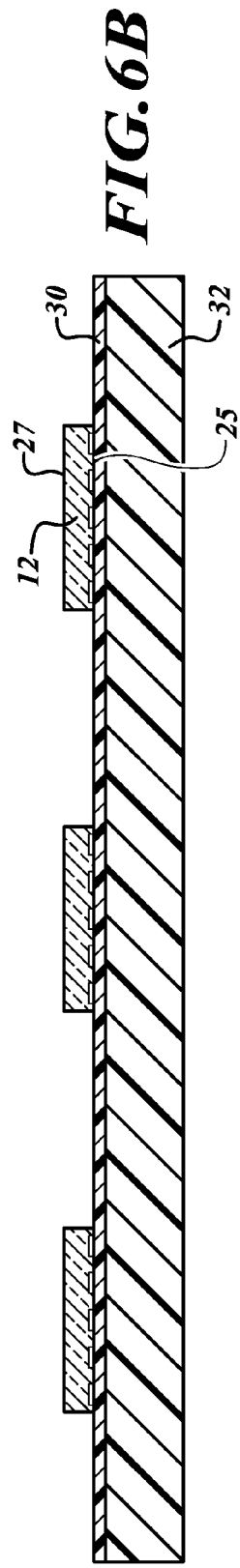

In FIG. 6A, the adhesive-covered foil 30 is laminated onto the carrier 32. In FIG. 6B, the semiconductor die 12 are placed onto the laminated carrier 32 with the active face 25 of the die 12 against the foil 30. The die 12 are held there by temporary adhesive on the foil 30.

Figure 6C:
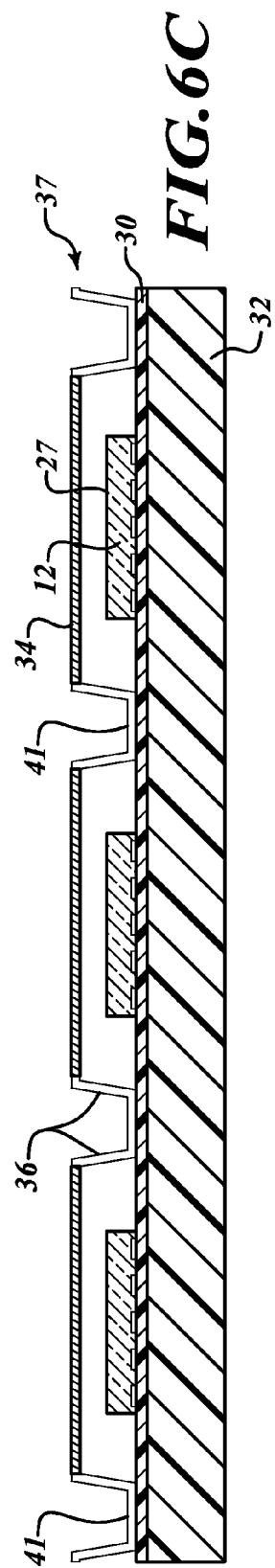
Figure 6D:
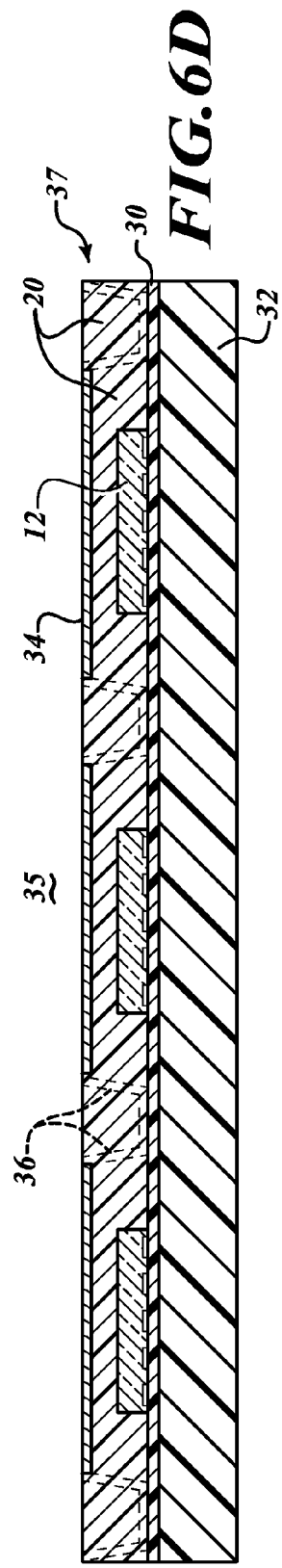

In FIG. 6C, the alternative heat dissipater frame 37 is placed on the laminated carrier 32. The alternative heat dissipater 34 is elevated above the semiconductor die 12 by the legs 36 so that space exists between the solid region of the heat dissipater 34 and the non-active face 27 of the die 12. In FIG. 6D, the encapsulant material 20 is dispensed beneath the alternative heat dissipater 34, so that the area adjacent to the die 12 is substantially occupied by the encapsulant material 20 from the foil 30 to the alternative heat dissipater 34. The surface of the alternative heat dissipater 34 facing away from the die 12 is exposed to the environment 35 and is not covered by the encapsulant material 20. A region surrounding the legs 36 of the dissipater 34 also receives the encapsulant material 20 up to a level approximately even with the top surface of the dissipater 34.

In FIG. 6E, the foil 30 and the carrier 32 are removed, exposing the active face 25 of the semiconductor die 12 and the lower face of the encapsulant material 20. In FIG. 6F, the redistribution layer 22 is applied to the exposed active face 25 of the semiconductor die 12 and the encapsulant material 20. In FIG. 6G, balls of the ball grid array 24 are placed on conductive pads of the redistribution layer 22 and each individual expanded wafer level ball grid array package 28 is singulated from the array by cutting along the dashed lines 43.

Figure 7:
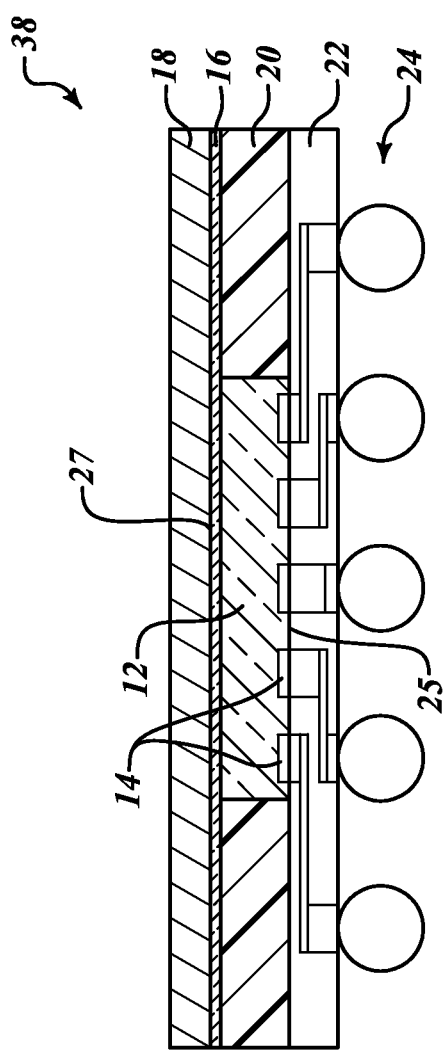
FIG. 7 shows a cross-sectional view of yet another embodiment of a thermally enhanced expanded wafer level ball grid array package.

FIG. 7 shows yet another embodiment of a thermally enhanced expanded wafer level ball grid array package 38. The embodiment 38 of FIG. 7 includes all the same components of the embodiment 10 described above and shown in FIG. 1.

In the embodiment 38 of FIG. 7, the thermal interface material 16 covers both the non-active face 27 of the die 12 and a face of the encapsulant material 20 on a plane approximately coincident with the non-active face 27 of the die 12. The heat dissipater 18 is positioned in direct contact with the thermal interface material layer 16 and in close proximity to the non-active face 27 of the semiconductor die 12. The heat dissipater 18 is separated from the semiconductor die 12 by the thermal interface material 16, which occupies the intervening space in order to enhance the thermal contact between them. The heat dissipater 18 extends beyond the edge of the die 12 and over the encapsulant material 20.

FIGS. 8A-8I show the steps in a method for making the thermally enhanced expanded wafer level ball grid array package 38 of FIG. 7. The method uses the heat dissipater frame 29 of FIGS. 2A and 2B. The cross-sectional views of FIGS. 8A-8I are taken at the same approximate position as the section line 2B-2B in FIG. 2A.

Figure 8A:
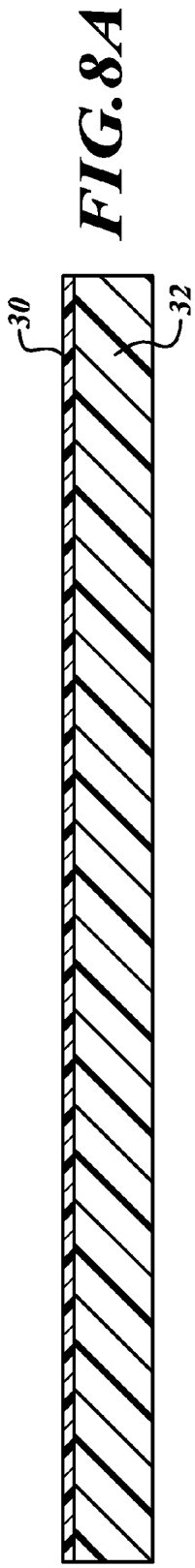
Figure 8B:
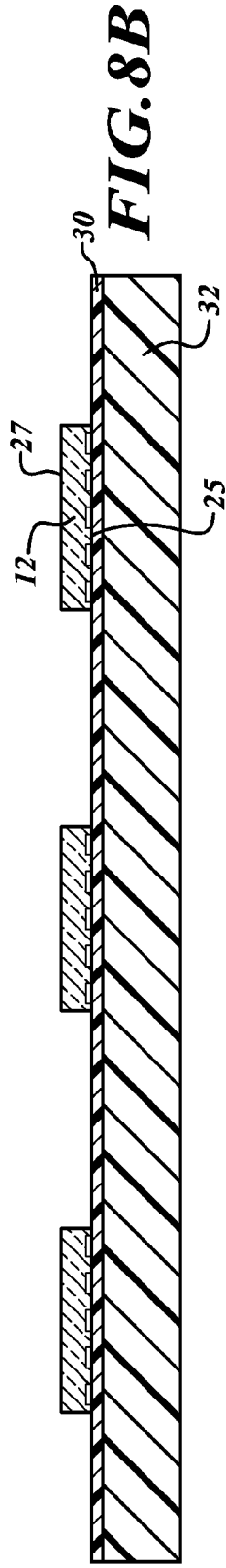
Figure 8C:
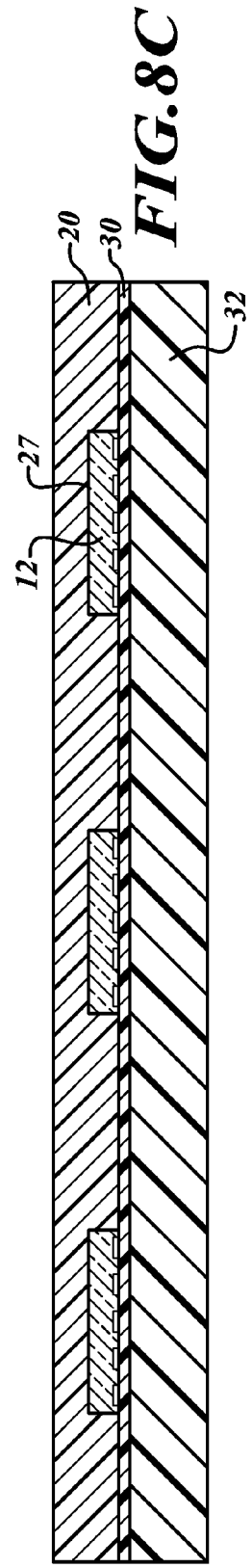

In FIG. 8A, the adhesive-covered foil 30 is laminated onto the carrier 32. In FIG. 8B, the semiconductor die 12 is placed on the laminated carrier 32 with the active face 25 of the die 12 against the foil 30. The die 12 are held onto the carrier 32 by temporary adhesive on the foil 30. In FIG. 8C, the encapsulant material 20 is dispensed over the placed semiconductor die 12, both adjacent to the semiconductor die 12 and over the non-active face 27 of the die 12.

Figure 8D:
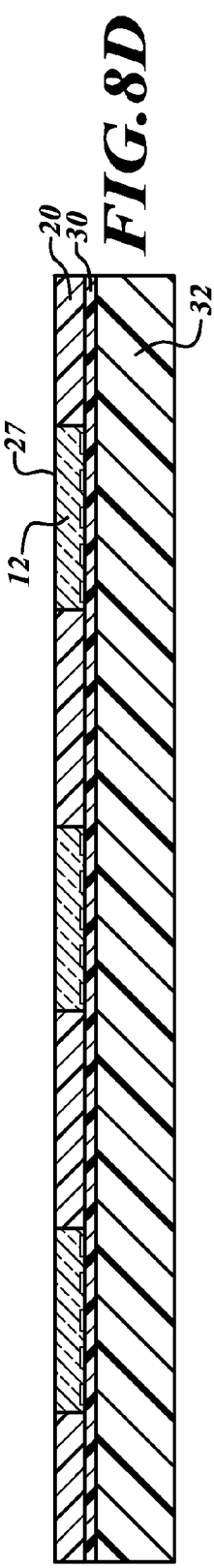

In FIG. 8D, a portion of the encapsulant material 20 is removed by grinding, polishing, chemical-mechanical polishing (CMP), or other techniques, starting with the encapsulant material 20 furthest from the carrier 32 and ending where the encapsulant material 20 is approximately even with the non-active face 27 of the die 12. In FIG. 8E, the thermal interface material 16 is dispensed onto both the non-active face 27 of the semiconductor die 12 and the encapsulant material 20 exposed by the removal step of FIG. 8D. In FIG. 8F, the heat dissipater frame 29 is placed on the thermal interface material 16, so that the heat dissipaters 18 are positioned above the semiconductor die 12.

Figure 8I:
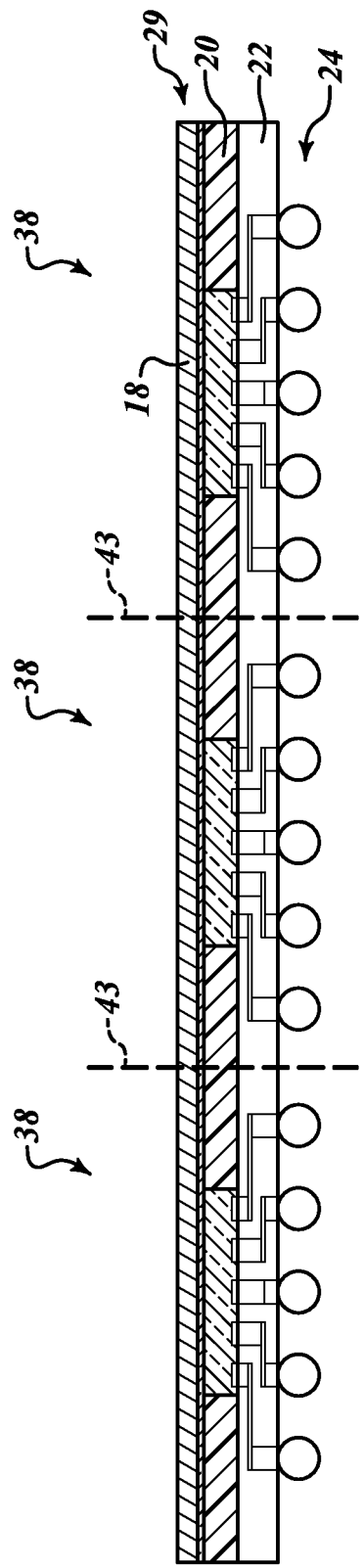

In FIG. 8G, the foil 30 and the carrier 32 are removed from the active face 25 of the semiconductor die 12 and the lower face of the encapsulant material 20. In FIG. 8H, the redistribution layer 22 is applied to the exposed active face 25 of the semiconductor die 12 and the lower face of the encapsulant material 20. In FIG. 8I, balls of the ball grid array 24 are placed on the redistribution layer 22 and the individual expanded wafer level ball grid array packages 38 are singulated by cutting along the lines 43.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An apparatus comprising:
a die having an active face and a non-active face;
signal output pads located on the die's active face;
a thermally conductive heat dissipater having a first surface and an opposed second surface, the first surface of the thermally conductive heat dissipater being positioned in close proximity to the die's non-active face and oriented to receive heat from the die, the thermally conductive heat dissipater extending laterally past the surface of the die;
an encapsulation material located on the entire second surface of the thermally conductive heat dissipater, the encapsulation material having a surface that extends approximately coincident from the die's active face;
package fan-out pads located over the surface of the encapsulation material and supported by the encapsulation material; and
electrically conductive traces that electrically connect the signal output pads with the package fan-out pads.

2. The apparatus of claim 1, further comprising a thermal interface material between the non-active die face and the heat dissipater.

3. The apparatus of claim 2 wherein the thermal interface material extends beyond the edge of the non-active die face onto a surface of the encapsulation material approximately coincident with the non-active die face.

4. The apparatus of claim 2 wherein the thermal interface material contains a thermally conductive filler material.

5. The apparatus of claim 1 wherein the heat dissipater directly contacts the non-active face of the die.

6. The apparatus of claim 1 wherein the heat dissipater includes legs that displace a portion of the heat dissipater away from the non-active die face.

7. The apparatus of claim 6 wherein the encapsulation material occupies a space between the heat dissipater and the non-active die face.

8. The apparatus of claim 1 wherein the heat dissipater is composed of at least one of copper alloy, Alloy 42, and aluminum.

9. A method for constructing an electronic package, the method comprising:
   placing at least one die having an active face and a non-active face onto a carrier with the active face proximate the carrier;
   placing a first surface of a heat dissipater onto the non-active face, the heat dissipater extending laterally beyond the at least one die;
   dispensing an encapsulation material into a space adjacent to the at least one die and onto an entire second surface of the heat dissipater, the second surface being opposed from first surface;
   removing the carrier from the at least one die to expose a plane that includes the active face of the at least one die and a surface of the dispensed encapsulation material;
   providing conductive traces that connect output pads on the active face with package fan-out pads supported by the surface of the encapsulation material; and
   singulating the electronic package from an encapsulated array of the at least one die.

10. The method of claim 9, further comprising dispensing a thermal interface material onto the non-active face before placing the heat dissipater onto the non-active face.

11. The method of claim 9 wherein dispensing further includes dispensing the encapsulation material into a space between the heat dissipater and the non-active face of the at least one die.

12. The method of claim 9 wherein the carrier includes a release-aiding film on at least one side.

13. A method for constructing an electronic package, the method comprising:
   placing at least one die having an active face and a non-active face onto a carrier with the active face proximate the carrier;
   placing a first portion of a heat dissipater onto the carrier, a second portion of the
   heat dissipater being located above the non-active die face to create a space therebetween;
   dispensing an encapsulation material into the space between the heat dissipater
   and the non-active die face and along a surface of the carrier;
   removing the carrier from the at least one die to expose a plane that includes the active face of the at least one die, the first portion of the heat dissipater and a surface of the dispensed encapsulation material;
   providing conductive traces that connect output pads on the active face with package fan-out pads supported by the surface of the encapsulation material; and
   singulating the electronic package from an encapsulated array of the at least one die.

14. The method of claim 13 further comprising dispensing a thermal interface material onto the non-active die face before placing the heat dissipater onto the carrier.

* * * * *